(12) United States Patent
Rosenthal

(10) Patent No.: US 10,517,193 B2
(45) Date of Patent: Dec. 24, 2019

(54) REGULATION METHOD FOR AN ELECTRICAL ENCLOSURE COOLING DEVICE

(71) Applicant: RITTAL GMBH & CO. KG, Herborn (DE)

(72) Inventor: Daniel Rosenthal, Siegen (DE)

(73) Assignee: Rittal GmbH & Co. KG (DE)

( * ) Notice: Subject to any disclaimer, the term of this patent is extended or adjusted under 35 U.S.C. 154(b) by 82 days.

(21) Appl. No.: 15/559,909

(22) PCT Filed: Mar. 22, 2016

(86) PCT No.: PCT/DE2016/100136
§ 371 (c)(1),
(2) Date: Sep. 20, 2017

(87) PCT Pub. No.: WO2016/155701
PCT Pub. Date: Oct. 6, 2016

(65) Prior Publication Data
US 2019/0124792 A1 Apr. 25, 2019

(30) Foreign Application Priority Data
Mar. 30, 2015 (DE) .................. 10 2015 104 843

(51) Int. Cl.
*G05B 19/042* (2006.01)
*H05K 7/20* (2006.01)
*G05D 23/19* (2006.01)

(52) U.S. Cl.
CPC ....... *H05K 7/20381* (2013.01); *G05B 19/042* (2013.01); *G05D 23/1919* (2013.01);
(Continued)

(58) Field of Classification Search
CPC .......... H05K 7/20381; H05K 7/20336; H05K 7/20172; H05K 7/20354; H05K 7/20209; G05B 19/042
See application file for complete search history.

(56) References Cited

U.S. PATENT DOCUMENTS 4,432,210 A 2/1984 Saito
5,934,079 A * 8/1999 Han .................. H05K 7/206
62/3.2
(Continued)

FOREIGN PATENT DOCUMENTS

DE 3207261 A1 10/1982
DE 102010009776 A1 9/2011
(Continued)

OTHER PUBLICATIONS

International Search Report (in English and German) and Written Opinion (in German) of the International Searching Authority issued in PCT/DE2016/100136, dated Jul. 13, 2016, ISA/EPO Rijswijk.

*Primary Examiner* — Christopher E. Everett
(74) *Attorney, Agent, or Firm* — Harness, Dickey & Pierce, PLC

(57) ABSTRACT

The invention relates to a regulation method for an electrical enclosure cooling device, which has a refrigerating machine and a heat pipe arrangement, wherein the method comprises measuring a current internal electrical enclosure temperature and determining a target temperature for the internal electrical enclosure temperature, wherein said internal electrical enclosure temperature and target temperature form input signals of a regulator for actuating the electrical enclosure cooling device, and wherein said regulator outputs a control signal for determining manipulated variables of the refrigerating machine; determining the regulator control signal as a measured variable which is proportional to the respective (Continued)

current required cooling power; measuring the ambient electrical enclosure temperature and determining a respective energy efficiency for the refrigerating machine and the heat pipe arrangement either in the event that the required cooling power is to be provided by the refrigerating machine or in the event that the required cooling power is to be provided by the heat pipe arrangement; and selecting and activating that one of the two coolant circuits that can provide the required cooling power with greater energy efficiency.

10 Claims, 3 Drawing Sheets

(52) U.S. Cl.
CPC ......... *H05K 7/207* (2013.01); *H05K 7/20172* (2013.01); *H05K 7/20209* (2013.01); *H05K 7/20336* (2013.01); *H05K 7/20354* (2013.01)

(56) References Cited

U.S. PATENT DOCUMENTS

| | | |
|---|---|---|
| 2005/0083654 A1 | 4/2005 | Tsoi |
| 2008/0221713 A1 | 9/2008 | Sadahira et al. |
| 2011/0132579 A1* | 6/2011 | Best .................. H05K 7/20763 165/104.31 |
| 2013/0037253 A1 | 2/2013 | Schneider et al. |
| 2015/0296665 A1 | 10/2015 | Cacho Alonso |
| 2015/0377509 A1 | 12/2015 | Nicolai et al. |
| 2017/0202109 A1 | 7/2017 | Cacho Alonso et al. |

FOREIGN PATENT DOCUMENTS

| | | |
|---|---|---|
| DE | 102012108110 A1 | 3/2014 |
| GB | 2329012 A | 3/1999 |
| WO | WO-03065781 A1 | 8/2003 |

* cited by examiner

REGULATION METHOD FOR AN ELECTRICAL ENCLOSURE COOLING DEVICE

CROSS-REFERENCE TO RELATED APPLICATIONS

This application is a 371 U.S. National Stage of International Application No. PCT/DE2016/100136, filed on Mar. 22, 2016, which claims priority to German Application 10 2015 104 843.4, filed on Mar. 30, 2015. The entire disclosures of the above applications are incorporated herein by reference.

FIELD

The invention relates to a regulation method for an electrical enclosure cooling device comprising a first coolant circuit with a refrigerating machine and a separate second coolant circuit with a heat pipe arrangement, wherein ambient air is conducted for heat dissipation through an outer circuit of the electrical enclosure cooling device and air to be cooled from the interior of an electrical enclosure to be cooled is conducted through an inner circuit of the electrical enclosure cooling device. An electrical enclosure arrangement having such an electrical enclosure cooling device is known, for example, from DE 10 2012 108 110 A1.

BACKGROUND

This section provides background information related to the present disclosure which is not necessarily prior art.

For energy-efficient operation of such electrical enclosure cooling devices, it is necessary to select at any operating point that coolant circuit from the two coolant circuits that can provide the required cooling power more efficiently. This requires one the one hand, knowledge of the required cooling power, that is, the cooling power needed to keep the internal electrical enclosure temperature at a target temperature. On the other hand, the efficiency or a representative energy efficiency value the respective coolant circuit has when it is to provide the currently required cooling power must be determined at the respective operating point.

In electrical enclosure cooling devices known from prior art, which are, for example, solely based on the principle of the refrigerating machine, and where the required cooling power and energy efficiency of the refrigerating machine are unknown, it is common to run the refrigerating machine at a predetermined speed regardless of the actual required cooling power, for example, at the maximum speed of the compressor, at which the refrigerating machine is expected to have its highest mean efficiency over its component life. Furthermore, operating the compressor at its maximum speed ensures that spikes in required cooling power can be compensated. Conversely, operating the refrigerating machine at a high compressor power output entails that the refrigerating machine must be run in a cycle operation in which the internal electrical enclosure temperature performs a hysteresis between an upper and lower threshold temperature around the target temperature. This has energy disadvantages, particularly compared to the ideal situation in which the refrigerating machine provides a cooling power that matches the required cooling power more or less accurately.

SUMMARY

This section provides a general summary of the disclosure, and is not a comprehensive disclosure of its full scope or all of its features.

It is the problem of the invention to provide a regulation method for an electrical enclosure cooling device with a refrigerating machine and a heat pipe arrangement, which at any operating point allows an optimal selection between the first and second coolant circuits based on energy efficiency aspects.

The method according to the invention comprises the following steps:

Continuous or periodic measuring of a current internal electrical enclosure temperature $T_i$ and determination of a target temperature for the internal electrical enclosure temperature $T_t$, wherein said current internal electrical enclosure temperature $T_i$ and target temperature form the input signals to a regulator for actuating the electrical enclosure cooling device, and wherein said regulator outputs a control signal for determining controlled variables of the refrigerating machine depending on said input signals;

Determination of a regulator signal as a measured variable which is proportional to the respective current cooling power P, wherein said required cooling power is that cooling power that is required to keep the internal electrical enclosure temperature $T_i$ constant at the target temperature;

Continuous or periodic measurement of an ambient electrical enclosure temperature $T_u$ and determination of a respective energy efficiency or a representative variable for the first and second coolant circuits at the measured temperatures $T_i$, $T_u$ and the target temperature using cooling device characteristics for the first and second coolant circuits either in the event that the required cooling power is to be provided by the first coolant circuit or in the event that the required cooling power is to be provided by the heat pipe arrangement; and Selecting and putting into operation that one of the two coolant circuits that can provide the required cooling power more energy efficiently.

The invention is thus based on the idea that the ambient electrical enclosure temperature is determined as an additional measured variable and to use the pair of internal electrical enclosure temperature and ambient electrical enclosure temperature to make an optimal selection between the two coolant circuits for a known estimated cooling power requirement. Estimating the required cooling power is based on the rationale that the regulator outputs control signals for determining controlled variables of the refrigerating machine to operate the electrical enclosure cooling device as a function of target temperature and internal electrical enclosure temperature, which signals are proportional to the required cooling power. When the regulator is, for example, a regulator for controlling a refrigerating machine, for example a PID controller, said regulator includes at least one manipulated variable for the speed of the fans of the refrigerating machine for transporting the air in the inner or outer circuit, respectively. The control signal of the regulator will further comprise a manipulated variable that is to preset the compressor speed. Assuming that the compressor speed and the fan speeds are proportional to the required cooling power, a required cooling power can therefore be derived from the control signal of the regulator. It is not required for executing the invention that a quantitatively exact value of the required cooling power is determined. Instead, estimating the required cooling power will suffice.

If the estimated required cooling power and the temperature difference between the internal electrical enclosure temperature and the ambient electrical enclosure temperature are known, it can therefore be estimated which of the two coolant circuits can provide the required cooling power determined in a more energy efficient manner.

In one embodiment of the invention, the manipulated variables, particularly the fan speeds and the compressor speed, for the first and second coolant circuits are assigned to a specific expected cooling power and energy efficiency by means of device characteristics, and wherein a circuit is activated using said device characteristics, such that the selected coolant circuit provides a cooling power that substantially corresponds to the required cooling power.

In another embodiment of the invention, the regulator is a PID controller for a refrigerating machine whose control signal as a function of the target temperature and the internal electrical enclosure temperature $T_i$ at least outputs one manipulated variable for at least one fan speed for transporting air through an inner or outer circuit of the cooling device and a compressor speed.

The manipulated variables can be assumed to be proportional to the required cooling power and they are transferred into an approximate value for the required cooling power using a transfer function, which can also just be a multiplier or conversion factor.

In yet another embodiment of the invention, the method further comprises estimating a maximum and/or minimum cooling power for the first and/or second cooling circuits at the measured temperatures $T_i$, $T_u$ and using the device characteristics.

The device characteristics can be stored in a database and set the cooling power provided at a given internal electrical enclosure temperature and a given ambient electrical enclosure temperature in relation to an expected energy efficiency.

Estimating the maximum and/or minimum cooling power for the first and/or second coolant circuits can be performed under the boundary condition that the respective other coolant circuit cannot provide the respective maximum and/or minimum cooling power with better energy efficiency.

The estimated required cooling power can in addition be used to optimize the cycle operation of a coolant circuit comprising a refrigerating machine. For this purpose, an embodiment of the invention is provided in which the method for the cycle operation of the refrigerating machine further comprises the determination of a cooling hysteresis with an upper and lower limit temperature around the target temperature, such that the switch-off time of the refrigerating machine during which the internal electrical enclosure temperature $T_i$ heats up from the lower limit temperature to the upper limit temperature corresponds to at least one minimum switch-off time of the compressor between successive active phases, wherein said switch-off time can be estimated based on $$t_{Ab} = \frac{C * \Delta T}{P},$$

wherein C is the predetermined, estimated, or experimentally obtained heat capacity of the electrical enclosure that has received the air to be cooled, $\Delta T$ is the difference in temperature between the upper and lower limits, and P is the estimated required cooling power.

According to another aspect of the invention, the required cooling power estimated based on the regulator control signal is not necessarily used for energy efficient operation of the electrical enclosure cooling device. Instead, the regulator control signal determined as a measured variable that is proportional to the respective current required cooling power can be output on a display or used for more advanced functions in electrical enclosure or data center air conditioning.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Further details of the invention are explained with reference to the figures below. Wherein.

DETAILED DESCRIPTION

Example embodiments will now be described more fully with reference to the accompanying drawings.

Figure 1:
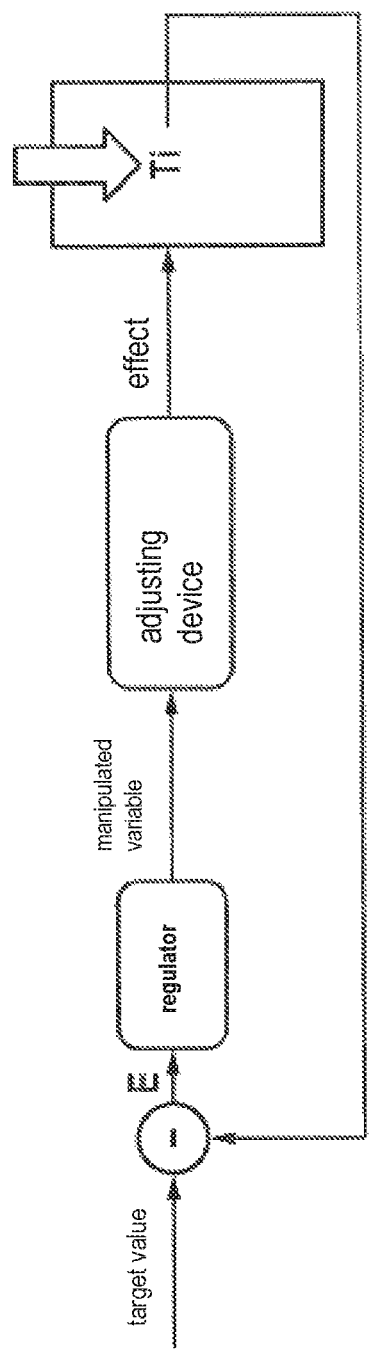
FIG. 1 shows a schematic view of a control loop according to prior art.

In the control loop according to prior art shown in FIG. 1, a target value for the internal electrical enclosure temperature is provided as input signal for a regulator. The regulator may for example be a PID controller. The PID controller determines manipulated variables in accordance with the cooling technology used for air conditioning the electrical enclosure, for example based on device characteristics that characterize the coolant circuit, which manipulated variables are passed on to the adjusting device in the form of an actuating signal. The adjusting device can for example be a refrigerating machine or a heat pipe arrangement.

If it is a refrigerating machine, the manipulated variables may for example be a compressor speed or at least one fan speed for at least one fan. The speed of the compressor and the fans is adjustable. The regulator determines the manipulated variables based on available device characteristics, such that at a given target temperature value and a measured internal electrical enclosure temperature Ti the adjusting device is preset such that the difference of target value and internal electrical enclosure temperature decreases. If the adjusting device is a refrigerating machine, the regulator can further be configured to operate in a cycle mode in which the internal electrical enclosure temperature performs a hysteresis between an upper and a lower limit around the target value. In prior art regulation methods, the manipulated variables are generally selected irrespective of the actual required cooling power which would be needed to keep the internal electrical enclosure temperature at the target value.

Figure 2:
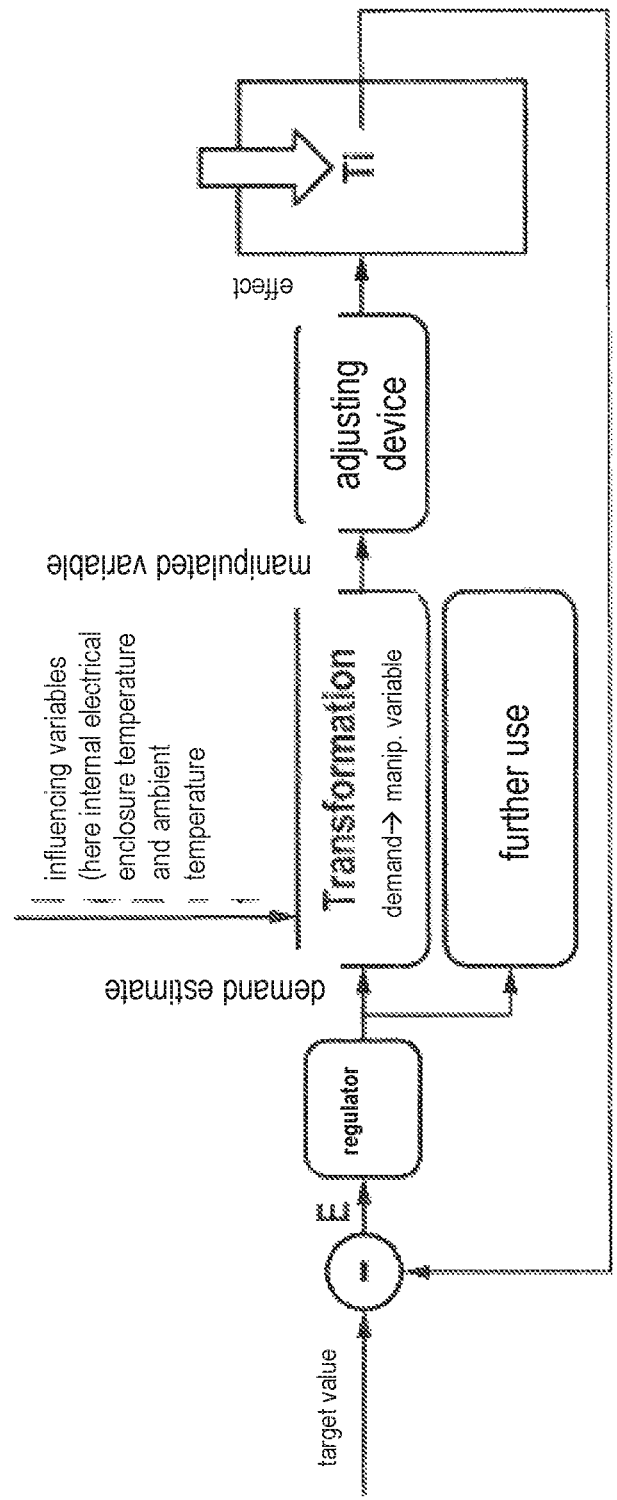
FIG. 2 shows a schematic view of a control loop according to a first embodiment of the invention.

FIG. 2 shows a schematic view of a control loop according to a first embodiment of the invention. The differential signal of target value and internal electrical enclosure temperature Ti is supplied to a regulator as input signal E here as well. Like in the regulation methods known from prior art, the regulator of the embodiment according to FIG. 2 can be a PID controller. It is essential for the invention that the output signal of the regulator is not immediately used as a manipulated variable which acts on the adjusting device, but is interpreted as a signal that is proportional to the required cooling power. This assumption is justified because the manipulated variables output by the regulator, for example, compressor or fan speeds, are proportional to the required cooling power, as described with reference to FIG. 1. Based on knowing this estimated required cooling power and the temperature difference between the internal electrical enclosure temperature and the ambient temperature, device characteristics can be used, for example, to determine which of the two coolant circuits can provide the estimated required cooling power with a greater energy efficiency.

In the embodiment shown in FIG. 2, the adjusting device can for example be an electrical enclosure cooling device comprising a heat pipe arrangement in addition to a refrigerating machine, which arrangement can be used alternatively for providing a required cooling power. The energy efficient cooling method for cooling the air in the electrical enclosure is selected based on whether the estimation of the energy efficiency of refrigerating machine and heat pipe arrangement found that in the given circumstances (required cooling power, internal electrical enclosure temperature, ambient electrical enclosure temperature) the one or the other cooling technology can provide the required cooling power with greater energy efficiency by forwarding the respective manipulated variables to the adjusting device.

It is furthermore conceivable that the estimated required cooling power is included for further use. As described above, the required cooling power can be used to optimize the hysteresis of a refrigerating machine such that the shut-off time between the active phases of the refrigerating machine currently corresponds to a minimum switch-off time of the compressor of the refrigerating machine which is needed to ensure the permanent operational safety of the refrigerating machine.

Figure 3:
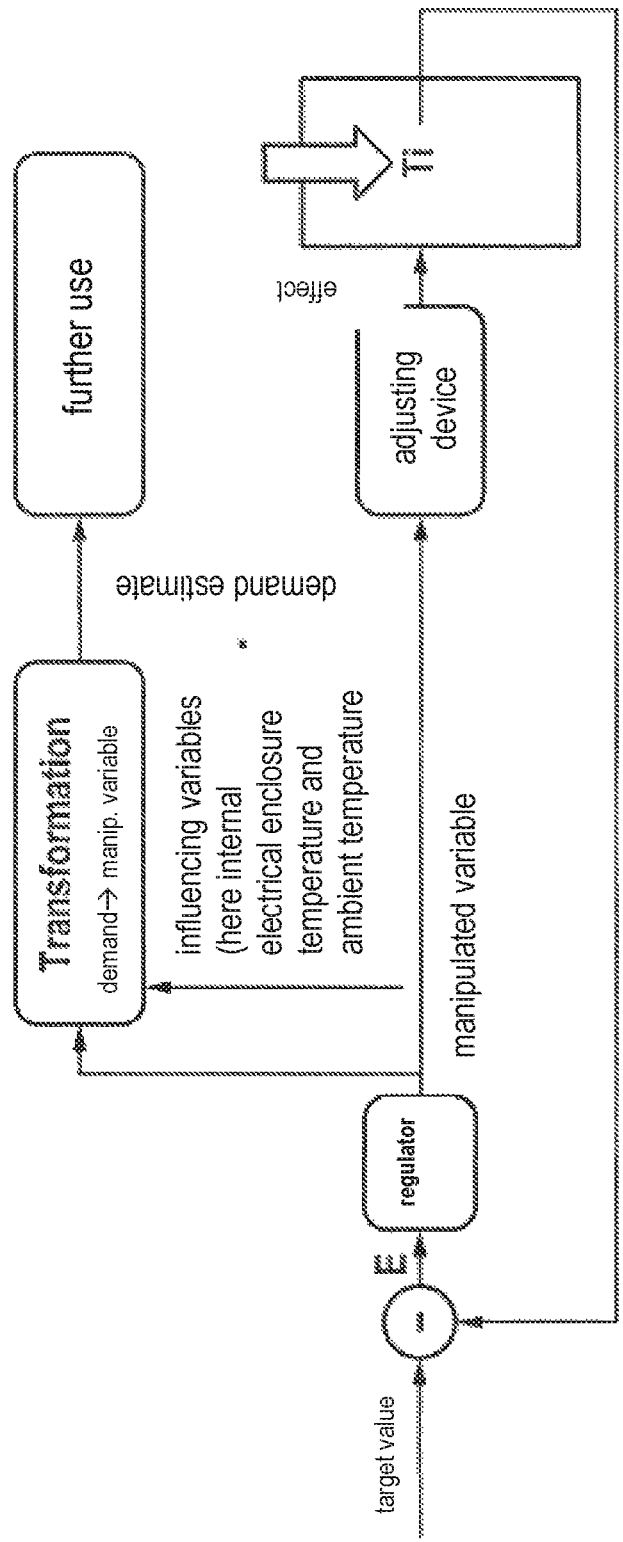
FIG. 3 shows a schematic view of a control loop according to another embodiment of the invention.

In the embodiment shown in FIG. 3, the control loop for cooling the electrical enclosure is like the one shown in FIG. 1 and known from prior art. But in the embodiment shown in FIG. 3, the output signal of the regulator, that is, the manipulated variables output to the adjusting device, is/are used in the manner described with reference to FIG. 2 for estimating the required cooling power, in which estimation once again the internal electrical enclosure temperature and the ambient electrical enclosure temperature are included as other influencing variables. This estimated required cooling power can be used in various ways for optimizing electrical enclosure operation or the operation of a data center in which multiple electrical enclosures are disposed and which comprises an energy management system. As mentioned above, the estimated required cooling power can be used to optimize the hysteresis of a refrigerating machine running in a cycle operation, such that the switch-off time between individual active phases of the compressor at least corresponds to a minimum switch-off time of a compressor.

The features of the invention disclosed in the above description, the drawings and the claims can be relevant both individually and in any combination for implementing the invention.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A regulation method for an electrical enclosure cooling device comprising a first coolant circuit with a refrigerating machine and a separate second coolant circuit with a heat pipe arrangement, wherein ambient air of an electrical enclosure is conducted for heat dissipation through an outer circuit of the electrical enclosure cooling device and air to be cooled from an interior of an electrical enclosure is conducted through an inner circuit of the electrical enclosure cooling device, the method comprising the following steps:

Continuous or periodic measuring of a current internal electrical enclosure temperature ($T_i$) and determination of a target temperature for the internal electrical enclosure temperature ($T_i$), wherein said current internal electrical enclosure temperature ($T_i$) and target temperature form the input signals to a regulator for actuating the electrical enclosure cooling device, and wherein said regulator outputs a control signal for determining controlled variables of the refrigerating machine depending on said input signals;

Determination of a regulator signal as a measured variable which is proportional to a respective current required cooling power (P), wherein said required cooling power is that cooling power that is required to keep the internal electrical enclosure temperature ($T_i$) constant at the target temperature;

Continuous or periodic measurement of an ambient electrical enclosure temperature ($T_u$) and determination of a respective energy efficiency or a representative variable for the first and second coolant circuits at the measured temperatures ($T_i$, $T_u$) and the target temperature using cooling device characteristics for the first and second coolant circuits either in the event that the required cooling power is to be provided by the refrigerating machine or in the event that the required cooling power is to be provided by the heat pipe arrangement; and Selecting and putting into operation that one of the two coolant circuits that can provide the required cooling power more energy efficiently; and wherein manipulated variables for the first and second coolant circuits are assigned to a specific expected cooling power and energy efficiency by means of device characteristics, and wherein a circuit is activated using said device characteristics such that the selected coolant circuit provides a cooling power that substantially corresponds to the required cooling power.

2. The method according to claim 1, wherein the regulator is a PID controller for a refrigerating machine whose control signal as a function of the target temperature and the internal electrical enclosure temperature ($T_i$) at least outputs one manipulated variable for at least one fan speed for transporting air through an inner or outer circuit of the cooling device, and a compressor speed.

3. The method according to claim 2, wherein the manipulated variables are assumed to be proportional to the required cooling power and are transferred into an approximate value for the required cooling power using a transfer function, which can also just be a multiplier or conversion factor.

4. The method according to claim 1, further comprising the estimation of a maximum and/or minimum cooling power for the first and/or second cooling circuits at the measured temperatures ($T_i$, $T_u$) and using the device characteristics.

5. The method according to claim 4, wherein estimating the maximum and/or minimum cooling power for the first and/or second coolant circuits is performed under the boundary condition that the respective other coolant circuit cannot provide the respective maximum and/or minimum cooling power with better energy efficiency.

6. The method according to claim 1, further comprising the step of:

Determination of a cooling hysteresis with an upper and lower limit temperature around the target temperature for the cycle operation of the refrigerating machine, such that a switch-off time of the refrigerating machine during which the internal electrical enclosure temperature ($T_i$) heats up from the lower limit temperature to the upper limit temperature corresponds to at least one minimum switch-off time of the compressor between successive active phases, wherein said switch-off time can be estimated based on $$t_{Ab} = \frac{C * \Delta T}{P},$$

wherein C is the predetermined, estimated, or experimentally obtained heat capacity of the electrical enclosure that has received the air to be cooled, $\Delta T$ is the difference in temperature between the upper and lower limits, and P is the estimated required cooling power.

7. A regulation method for an electrical enclosure cooling device comprising a first coolant circuit with a refrigerating machine and a separate second coolant circuit with a heat pipe arrangement, wherein ambient air is conducted for heat dissipation through an outer circuit of the electrical enclosure cooling device and air to be cooled from an interior of an electrical enclosure to be cooled is conducted through an inner circuit of the electrical enclosure cooling device, the method comprising the following steps:

Continuous or periodic measuring of a current internal electrical enclosure temperature ($T_i$) and determination of a target temperature for the internal electrical enclosure temperature ($T_i$), wherein said current internal electrical enclosure temperature ($T_i$) and target temperature form the input signals to a regulator for actuating the electrical enclosure cooling device, and wherein said regulator outputs a control signal for determining controlled variables of the refrigerating machine depending on said input signals;

Determination of a regulator signal as a measured variable which is proportional to a respective current required cooling power (P), wherein said required cooling power is that cooling power that is required to keep the internal electrical enclosure temperature ($T_i$) constant at the target temperature;

Outputting the measured variable that is proportional to the respective current required cooling power (P) for further use on a display or a regulating and control unit for electrical enclosure air conditioning; and Determination of a cooling hysteresis with an upper and lower limit temperature around the target temperature for a cycle operation of the refrigerating machine, such that a switch-off time of the refrigerating machine during which the internal electrical enclosure temperature ($T_i$) heats up from the lower limit temperature to the upper limit temperature corresponds to at least one minimum switch-off time of the compressor between successive active phases, wherein said switch-off time can be estimated based on $$t_{Ab} = \frac{C * \Delta T}{P},$$

wherein C is the predetermined, estimated, or experimentally obtained heat capacity of the electrical enclosure that has received the air to be cooled, $\Delta T$ is the difference in temperature between the upper and lower limits, and P is the estimated required cooling power.

8. A regulation method for an electrical enclosure cooling device comprising a first coolant circuit with a refrigerating machine and a separate second coolant circuit with a heat pipe arrangement, wherein ambient air of an electrical enclosure is conducted for heat dissipation through an outer circuit of the electrical enclosure cooling device and air to be cooled from an interior of an electrical enclosure is conducted through an inner circuit of the electrical enclosure cooling device, the method comprising the following steps:

Continuous or periodic measuring of a current internal electrical enclosure temperature ($T_i$) and determination of a target temperature for the internal electrical enclosure temperature ($T_i$), wherein said current internal electrical enclosure temperature ($T_i$) and target temperature form the input signals to a regulator for actuating the electrical enclosure cooling device, and wherein said regulator outputs a control signal for determining controlled variables of the refrigerating machine depending on said input signals;

Determination of a regulator signal as a measured variable which is proportional to a respective current required cooling power (P), wherein said required cooling power is that cooling power that is required to keep the internal electrical enclosure temperature ($T_i$) constant at the target temperature;

Continuous or periodic measuring of a current internal electrical enclosure temperature ($T_u$) and determination of a respective energy efficiency or a representative variable for the first and second coolant circuits at the measured temperatures ($T_i$, $T_u$) and the target temperature using cooling device characteristics for the first and second coolant circuits either in the event that the required cooling power is to be provided by the refrigerating machine or in the event that the required cooling power is to be provided by the heat pipe arrangement;

Selecting and putting into operation that one of the two coolant circuits that can provide the required cooling power more energy efficiently;

manipulated variables for the first and second coolant circuits are assigned to a specific expected cooling power and energy efficiency by means of device characteristics, and wherein a circuit is activated using said device characteristics such that the selected coolant circuit provides a cooling power that substantially corresponds to the required cooling power; and further comprising the estimation of a maximum and/or minimum cooling power for the first and/or second cooling circuits at the measured temperatures ($T_i$, $T_u$) and using the device characteristics.

9. A regulation method for an electrical enclosure cooling device comprising a first coolant circuit with a refrigerating machine and a separate second coolant circuit with a heat pipe arrangement, wherein ambient air of an electrical enclosure is conducted for heat dissipation through an outer circuit of the electrical enclosure cooling device and air to be cooled from an interior of an electrical enclosure is conducted through an inner circuit of the electrical enclosure cooling device, the method comprising the following steps:

Continuous or periodic measuring of a current internal electrical enclosure temperature ($T_i$) and determination of a target temperature for the internal electrical enclosure temperature ($T_i$), wherein said current internal electrical enclosure temperature ($T_i$) and target temperature form the input signals to a regulator for actuating the electrical enclosure cooling device, and wherein said regulator outputs a control signal for determining controlled variables of the refrigerating machine depending on said input signals;

Determination of a regulator signal as a measured variable which is proportional to a respective current required cooling power (P), wherein said required cooling power is that cooling power that is required to keep the internal electrical enclosure temperature ($T_i$) constant at the target temperature;

Continuous or periodic measuring of a current internal electrical enclosure temperature ($T_u$) and determination of a respective energy efficiency or a representative variable for the first and second coolant circuits at the measured temperatures ($T_i$, $T_u$) and the target temperature using cooling device characteristics for the first and second coolant circuits either in the event that the required cooling power is to be provided by the refrigerating machine or in the event that the required cooling power is to be provided by the heat pipe arrangement;

Selecting and putting into operation that one of the two coolant circuits that can provide the required cooling power more energy efficiently;

Determination of a cooling hysteresis with an upper and lower limit temperature around the target temperature for the cycle operation of the refrigerating machine, such that a switch-off time of the refrigerating machine during which the internal electrical enclosure temperature ($T_i$) heats up from the lower limit temperature to the upper limit temperature corresponds to at least one minimum switch-off time of the compressor between successive active phases, and wherein said switch-off time can be estimated based on $$t_{Ab} = \frac{C * \Delta T}{P},$$

wherein C is the predetermined, estimated, or experimentally obtained heat capacity of the electrical enclosure that has received the air to be cooled, ΔT is the difference in temperature between the upper and lower limits, and P is the estimated required cooling power.

10. A regulation method for an electrical enclosure cooling device comprising a first coolant circuit with a refrigerating machine and a separate second coolant circuit with a heat pipe arrangement, wherein ambient air of an electrical enclosure is conducted for heat dissipation through an outer circuit of the electrical enclosure cooling device and air to be cooled from an interior of an electrical enclosure is conducted through an inner circuit of the electrical enclosure cooling device, the method comprising the following steps:

Continuous or periodic measuring of a current internal electrical enclosure temperature ($T_i$) and determination of a target temperature for the internal electrical enclosure temperature ($T_i$), wherein said current internal electrical enclosure temperature ($T_i$) and target temperature form the input signals to a regulator for actuating the electrical enclosure cooling device, and wherein said regulator outputs a control signal for determining controlled variables of the refrigerating machine depending on said input signals;

Determination of a regulator signal as a measured variable which is proportional to a respective current required cooling power (P), wherein said required cooling power is that cooling power that is required to keep the internal electrical enclosure temperature ($T_i$) constant at the target temperature;

Continuous or periodic measuring of a current internal electrical enclosure temperature ($T_u$) and determination of a respective energy efficiency or a representative variable for the first and second coolant circuits at the measured temperatures ($T_i$, $T_u$) and the target temperature using cooling device characteristics for the first and second coolant circuits either in the event that the required cooling power is to be provided by the refrigerating machine or in the event that the required cooling power is to be provided by the heat pipe arrangement;

Selecting and putting into operation that one of the two coolant circuits that can provide the required cooling power more energy efficiently; and wherein the regulator is a PID controller for a refrigerating machine whose control signal as a function of the target temperature and the internal electrical enclosure temperature ($T_i$) at least outputs one manipulated variable for at least one fan speed for transporting air through an inner or outer circuit of the cooling device, and a compressor speed.

\* \* \* \* \*